United States Patent
Tung et al.

(10) Patent No.: US 6,675,337 B1
(45) Date of Patent: Jan. 6, 2004

(54) BUILT-IN SELF VERIFICATION CIRCUIT FOR SYSTEM CHIP DESIGN

(75) Inventors: Shing-Wu Tung, Taipei (TW); Chun-Yao Wang, Taipei Hsien (TW); Jing-Yang Jou, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 453 days.

(21) Appl. No.: 09/630,905

(22) Filed: Aug. 2, 2000

(30) Foreign Application Priority Data

Apr. 21, 2000 (TW) ........................... 89107511 A (51) Int. Cl.[7] .............................................. G01R 31/28
(52) U.S. Cl. ........................................ 714/733; 714/734
(58) Field of Search ................................ 714/733, 727, 714/732, 724, 734

(56) References Cited

U.S. PATENT DOCUMENTS

| | | | |
|---|---|---|---|
| 5,619,512 A | * | 4/1997 | Kawashima et al. ........ 714/733 |
| 5,668,817 A | | 9/1997 | Adham |
| 5,751,737 A | | 5/1998 | Lagrotta et al. |
| 5,790,562 A | | 8/1998 | Murray et al. |
| 5,831,991 A | | 11/1998 | Miller et al. |
| 5,923,677 A | | 7/1999 | Aihara |
| 5,938,784 A | | 8/1999 | Kim |
| 5,960,009 A | | 9/1999 | Gizopoulos et al. |

OTHER PUBLICATIONS

"On Automatic–Verification Pattern Generation for SoC With Port–Order Fault Model".
Chun–Yao Wang, Shing–Wu Tung and Jing–Yang Jou / IEEE Transaction on computer–Aided design of integrated circuits and systems, Vol, 21, No. 4, Apr. 2002/ pp. 466–479.

"Writing Testbenches–Functional Verification of HDL Models" Janick Bergeron / pp. 12–14.

* cited by examiner

Primary Examiner—Albert Decady
Assistant Examiner—Mujtaba Chaudry
(74) Attorney, Agent, or Firm—J. C. Patents (57) ABSTRACT

A built-in verification circuit having a circuit-under-test circuit, a test pattern generator, a bi-directional signal flow switch and three unidirectional, signal flow switches. The test pattern generator produces a testing pattern based on an input/output port order fault model. The bi-directional signal flow switch is positioned between the input terminal of the built-in verification circuit and the circuit-under-test circuit. The first unidirectional signal flow switch is positioned between the circuit-under-test circuit and the test pattern generator. The second unidirectional signal flow switch is positioned between the circuit-under-test circuit and the output terminal of the built-in verification circuit. The third unidirectional signal flow switch is positioned between the test pattern generator and the output terminal of the built-in verification circuit. The bi-directional signal flow switch and the first unidirectional signal flow switch are used for controlling the input terminal of the built-in verification circuit and the signal flow direction of the test pattern generator. The second and the third unidirectional signal flow switch are used for controlling the signal source of the output from the built-in verification circuit.

10 Claims, 9 Drawing Sheets

BUILT-IN SELF VERIFICATION CIRCUIT FOR SYSTEM CHIP DESIGN

CROSS-REFERENCE TO RELATED APPLICATION

This application claims the priority benefit of Taiwan application serial no. 89107511, filed Apr. 21, 2000.

BACKGROUND OF THE INVENTION

1. Field of Invention

The present invention relates to a built-in self-verification (BISV) circuit. More particularly, the present invention relates to a built-in self-verification circuit for system chip design. The BISV circuit not only can be applied to test system chip design during integration, but also can used to detect common design errors. Moreover, the BISV circuit can be applied to test out functional uniformity of intellectual property (IP) based on the electronic design automation (EDA) model.

2. Description of Related Art

Trend in the development of system chip design offers some challenges to design verification and testing. The basic functional block of system chip is generally referred to as reusable design or IP. Built-in testing and verification functions are regarded as a major aspect in accelerating the process of verifying a system chip design. However, the conventional stuck-at fault model of testing pattern generation is mainly used for detecting manufacturing faults. If the operation is used for testing functions in system integration, time is wasted in testing already verified IP blocks. Moreover, conventional automatic test pattern generator (ATPG) can only be applied to circuit having a logic netlist model. Thus, circuit function meeting the design specification is assumed when the test pattern is generated. Hence, the test pattern of stuck-at fault based on the interconnection of internal devices is incapable of verifying the design specification. Another method includes the use of a pseudo-random number generator to produce a functional verification input pattern. Although potentially the method has better functional coverage, testing time and length of the test pattern tend to increase in proportional to the number of input ports.

Built-in self-testing (BIST) and related technical considerations can be found in the following disclosed U.S. Patents:

(1) U.S. Pat. No. 5,960,009 titled "Built-in shelf test method and apparatus for booth multipliers";

(2) U.S. Pat. No. 5,923,677 titled "Method and apparatus for detecting failures between circuits";

(3) U.S. Pat. No. 5,831,991 titled "Methods and apparatus for electrically verifying a functional unit contained within an integrated circuit";

(4) U.S. Pat. No. 5,751,737 titled "Boundary scan testing device";

(5) U.S. Pat. No. 5,668,817 titled "Self-testable digital signal processor and method for self-testing of integrating circuits including DSP data paths";

(6) U.S. Pat. No. 5,938,784 titled "Linear feedback shift register, multiple input signature register, and built-in self test circuit using such registers";

(7) U.S. Pat. No. 5,790,562 titled "Circuit with built-in test and method thereof".

Careful analysis of the aforementioned U.S. patents reveals some major differences compared with the structural design proposed according to this invention. The majority of the cases aim at saving a few circuit devices and reducing area occupation when built-in testing circuit is integrated with the original design. However, a different kind of detachable built-in testing circuit and method, as well as a different corresponding structure for generating test pattern based on detecting input/output sequence errors are proposed in this invention.

The so-called boundary scan technique is commonly used in design verifications. The characteristics of such techniques differ from the structure proposed in this invention in two major aspects:

(1) Boundary scan technique usually does not embed a test pattern generating circuit with device under test (DUT which also known as pre-designed and pre-verified functional block in system chip design); and (2) Boundary scan technique is based on serial transmission. Hence, the testing is designed around inter-block communication.

On the other hand, the proposed invention has no limitations during testing or operating in normal mode. Blocks can be connected either serially or parallelly depending on the actual requirement in the system chip design. Hence, through this invention, any section of lines in the figure can represent sequentially connected lines or parallel transmission lines.

Built-in self-testing (BIST) technique aims at finding defects in the circuit during manufacturing. Concepts behind the BIST technique can be illustrated using FIG. 1.

Figure 1:
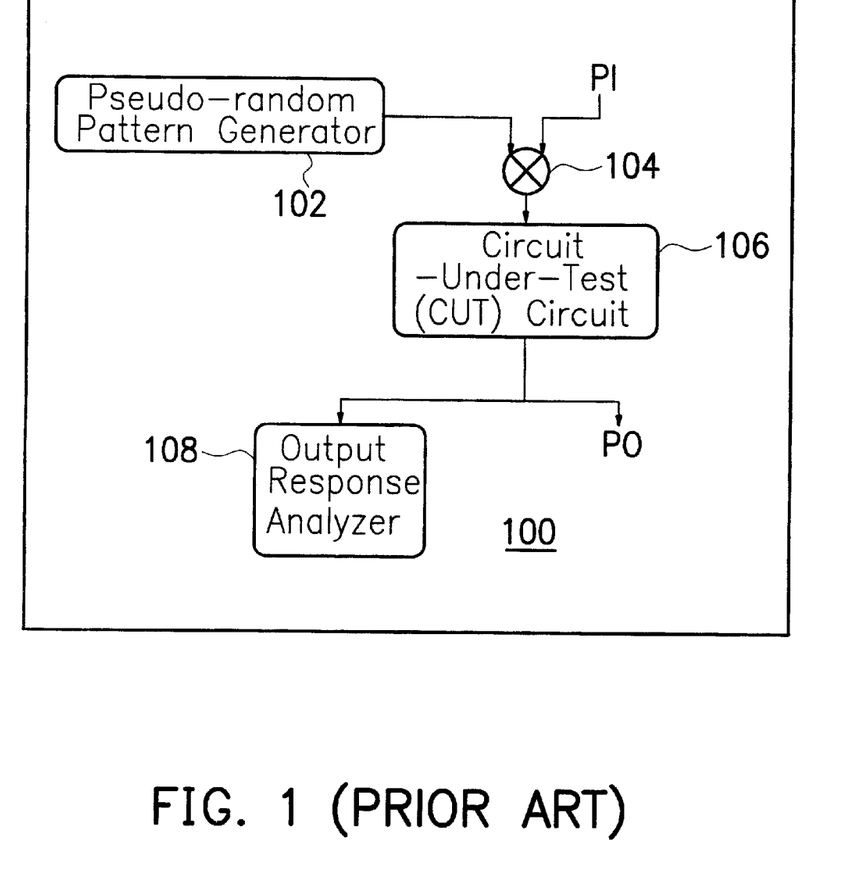
FIG. 1 is a schematic diagram showing the basic structure of a conventional BIST circuit.

FIG. 1 is a schematic diagram showing the basic structure of a conventional BIST circuit. As shown in FIG. 1, the BIST circuit 100 includes a pseudo-random pattern generator (PRPG) 102, a multiplexer (MUX) 104, a circuit-under-test (CUT) 106 and an output response analyzer (ORA) 108. Conventional clock pulse and control signals are omitted in the figure for simplification.

In normal execution state, the primary input (PI) and the PRPG circuit 102 in the testing mode are connected to the input terminal of the CUT circuit 106 via the multiplexer 104. Aside from connecting to the primary output, the CUT circuit 106 also connects to the output response analyzer 108 so that any deviation of the output value from the CUT 106 and the expected value can be determined. In general, the ORA 108 is also responsible for compressing output data so that the less space is required for storing test output data.

A conventional BIST circuit aims mainly at detecting faults in manufacturing. Consequently, some common design faults may not be found when integrating the virtual components of system chips or functional blocks commonly referred to as IP. In the process of integrating with the already tested IP design blocks, the most common problems are unlikely to be errors in the design of individual functional block. Rather, most problems will occur in the configuration of connecting lines between the blocks. For example, the bits in a bus should be in the sequential order (31:0) or (0:31). This type of design fault is often referred to as port order fault (POF) for input or output. Characteristics of POF can be obtained from article [1] below.

[1]: Shing-Wu Tung and Jing-Yang Jou, "A Logical Fault Model for Library Coherence Checking", Journal of Information Science and Engineering, Vol.14 No. 3, pp. 567–586, September 1998.

FIGS. 2A through 2D are block diagrams showing four 4-bit adders having no fault, a first port order fault, a second port order fault and a third port order fault respectively. In the figures, $C_{IN}$ represents signal input terminal, $C_{OUT}$ represents signal output terminal, $A_0$–$A_3$ and $B_0$–$B_3$ represent input ports and $S_0$–$S_3$ represent output ports.

Figure 2A:
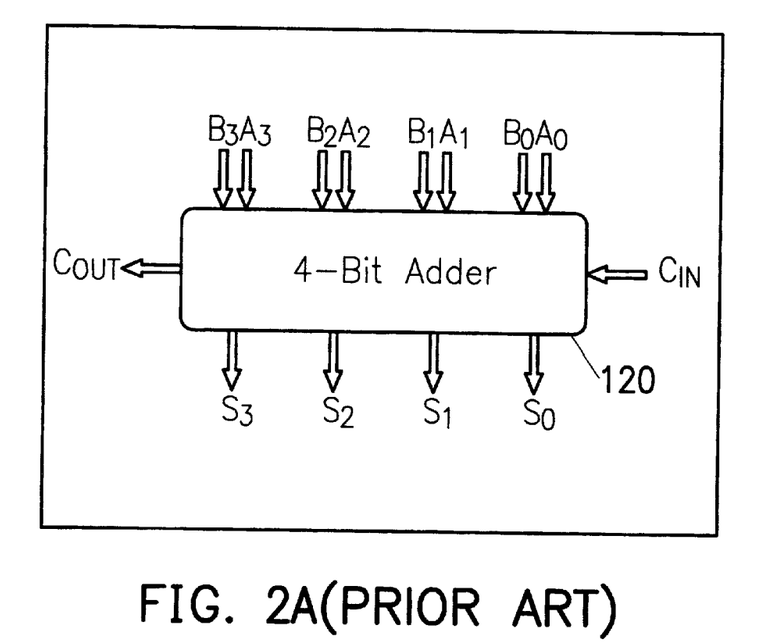
FIGS. 2A through 2D are block diagrams showing four 4-bit adders having no fault, a first port order fault, a second port order fault and a third port order fault respectively.
Figure 2B:
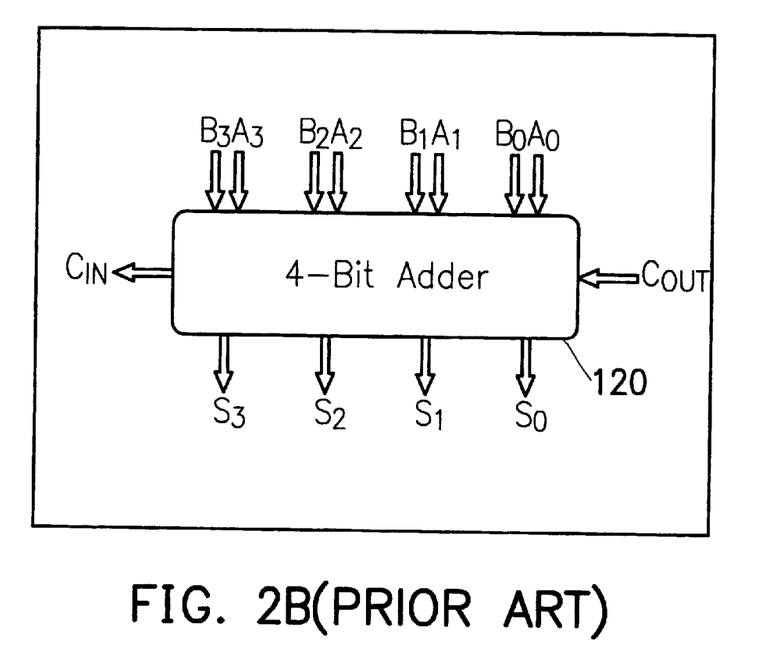
Figure 2C:
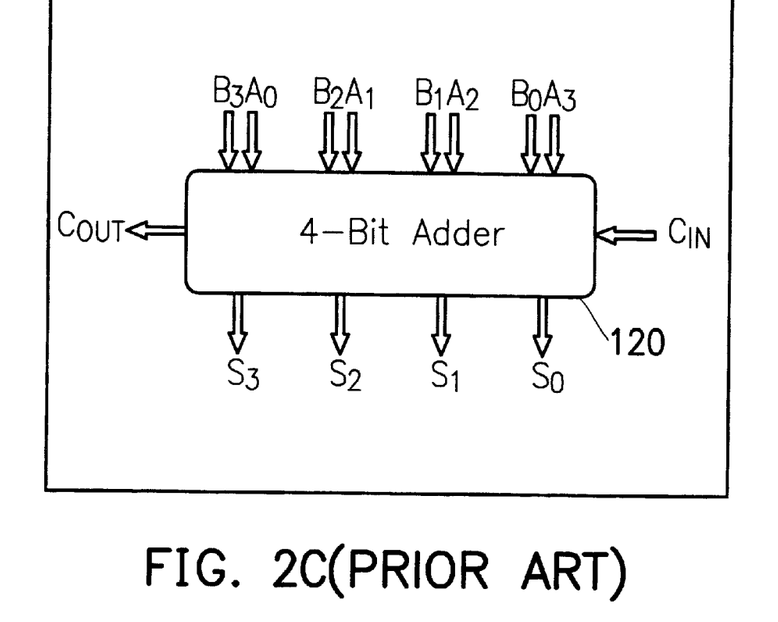
Figure 2D:
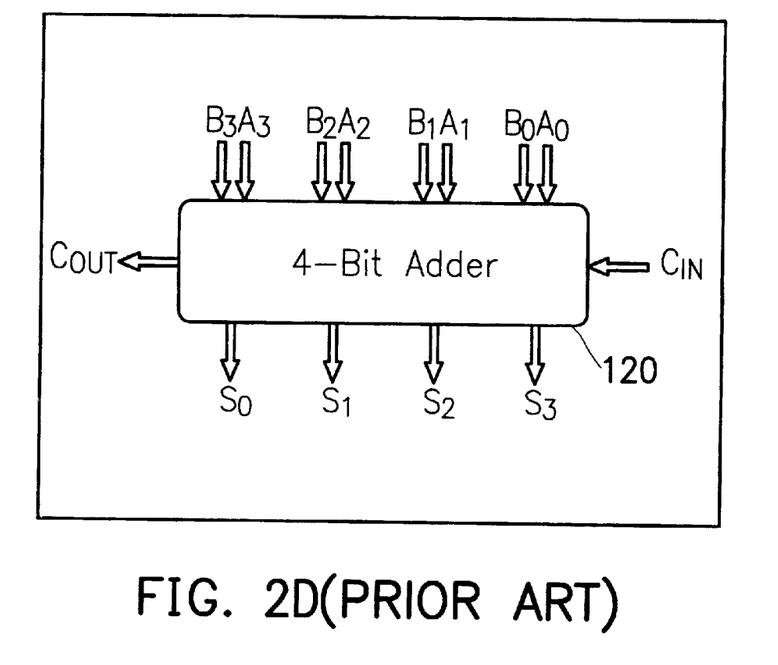

The meanings implied in FIGS. 2A–2D are as follows:

(1) FIG. 2A indicates a no-fault condition: the ordering of the output terminals $C_{IN}$ and $C_{OUT}$ and input/output ports $A_0$–$A_3$, $B_0$–$B_3$ and $S_0$–$S_3$ are correct;

(2) FIG. 2B shows a first port order fault (POF): the ordering between the input terminal $C_{IN}$ and the output terminal $C_{OUT}$ is wrong;

(3) FIG. 2C shows a second POF: the ordering of the input ports $A_0$–$A_3$ is wrong; and (4) FIG. 2D shows a third POF: the ordering of the output ports $S_0$–$S_3$ is wrong.

The first type of POF can be checked by generating a random test pattern as indicated in article [1]. Hence, integrated verification of the chip should target the two remaining types of POFs.

In general, the most common IP integration faults include interface design errors, faulty/short-circuiting/erroneous connections (for example: POF), mismatch communication protocol and so on.

Figure 3:
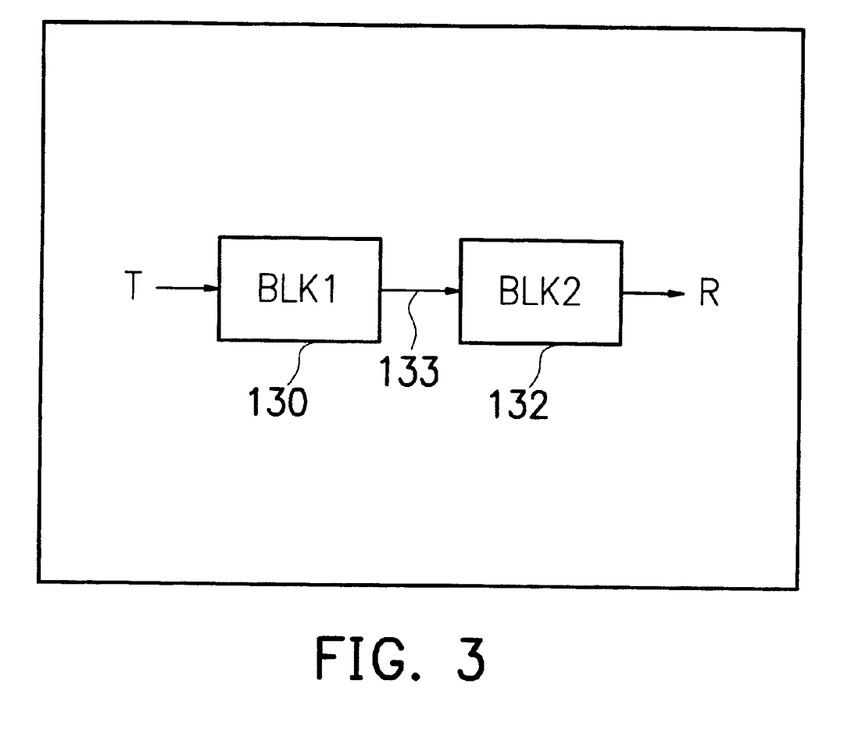
FIG. 3 is a block diagram showing the theory behind the detection of integration faults.

FIG. 3 is a block diagram showing the theory behind the detection of port order failure. Besides detecting errors in the connecting line 133 between pre-designed blocks, the aforementioned integration faults can also be found. A test pattern T is fed to the input terminal of the functional block (BLK1) 130, and then a response R is obtained from the output terminal of a subsequent functional block (BLK2) 132. The response from the second functional block 132 can be compared with an expected value. The operating function of the first block 130 can be the same or different from the second functional block 132.

SUMMARY OF THE INVENTION

Accordingly, one objective of the present invention is to provide a built-in verification circuit. The built-in verification circuit has an input terminal and an output terminal. The circuit includes a circuit-under-test, a test pattern generator, a bi-directional signal flow switch, a first unidirectional signal flow switch, a second unidirectional signal flow switch and a third unidirectional signal flow switch. The bi-directional signal flow switch is positioned between the input terminal of the built-in verification circuit and the circuit-under-test circuit. The first unidirectional signal flow switch is positioned between the circuit-under-test circuit and the test pattern generator. The second unidirectional signal flow switch is positioned between the circuit-under-test circuit and the output terminal of the built-in verification circuit. The third unidirectional signal flow switch is positioned between the test pattern generator and the output terminal of the built-in verification circuit. The bi-directional signal flow switch and the first unidirectional signal flow switch are used for controlling the input terminal of the built-in verification circuit and the signal flow of the test pattern generator. The second unidirectional signal flow switch and the third unidirectional signal flow switch are used for controlling the signal source output from the output terminal of the built-in verification circuit. The testing pattern is produced by the test pattern generator according to the input/output POF model.

According to this invention, the built-in verification circuit operates in a normal output and input mode when both the bi-directional signal flow switch and the second unidirectional signal flow switch are opened while both the first unidirectional signal flow switch and the third unidirectional signal flow switch are closed.

According to this invention, the built-in verification circuit operates in a built-in self-testing mode when both the first unidirectional signal flow switch and the second unidirectional signal flow switch are opened while both the bi-directional signal flow switch and the third unidirectional signal flow switch are closed.

According to this invention, the built-in verification circuit operates in a second POF testing mode when both the bi-directional signal flow switch and the first unidirectional signal flow switch are opened. In the second POF testing mode, an external test pattern generator outside the built-in verification circuit and having identical functions as the test pattern generator is included. The output from the external test pattern generator and the output from the test pattern generator via the first unidirectional signal flow switch and the bi-directional signal flow switch are compared using a comparator. Thus, any second POF problems in the built-in verification circuit can be verified.

According to this invention, the built-in verification circuit operates in a third POF testing mode when the second signal flow switch is closed while the third unidirectional signal flow switch is opened. In the third POF testing mode, a signal at the output terminal of the built-in verification circuit is provided by the test pattern generator. Furthermore, signals from the output terminal of the built-in verification circuit and signals from an external test pattern generator having identical functions as the test pattern generator are compared using a comparator. Thus, any third POF problems in the built-in verification circuit can be verified.

According to this invention, the built-in verification circuit operates in an equivalent testing mode when the bi-directional signal flow switch, the first unidirectional signal flow switch and the second unidirectional signal flow switch are opened while the third unidirectional signal flow switch is closed. In the equivalent testing mode, input signals to an external circuit-under-test circuit outside the built-in verification circuit for standard comparison and the input signals to the circuit-under-test circuit inside the built-in verification circuit are provided by a test pattern generator. Furthermore, an external comparator is used to compare the output from the internal circuit-under-test circuit and the external circuit-under-test circuit. Through a comparison between the output signals from the respective circuit-under-test circuits, any functional non-uniformity can be verified.

According to this invention, the built-in verification circuit operates in an isolation mode when both the second unidirectional signal flow switch and the third unidirectional signal flow switch are closed. Thus, the next stage circuit can be tested in a simpler environmental setup.

The built-in verification circuit of this invention has a detachable built-in testing pattern generator for producing test pattern according to the input/output POF model, a switch capable of selecting a particular output port signal source and an input port signal selection switch necessary for bi-directional signal transmission. Thus, the invention can be used to verify system chip design during the integration stage. If test pattern for detecting manufacturing faults is added, the invention can be used for testing a fabricated chip. Moreover, since the structure of this invention is based on the input/output POF model, common design errors as well as any non-uniformity of IP in the EDA model can be detected. Furthermore, the detachable design of the test pattern generator circuit permits not only the integration of system chip testing, but also the incorporation of a test collection from a conventional automatic test pattern generator (ATPG) so that fabricated chip testing can be carried out.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

This invention provides a built-in self-verification (BISV) circuit structure. The BISV circuit can be used not only for the verification of system chip design during the integrative phase, but also for testing actual chip if test pattern for checking manufacturing defects is also incorporated.

Based on the input/output port order fault (POF) model of design verification, built-in design verification circuit architecture is provided in this invention. Thus, common design errors as well as any non-uniformity of IP in the EDA model can be detected. In addition, the detachable design of the test pattern generator (TPG) circuit permits not only the integration of system chip testing, but also the incorporation of a test collection from a conventional automatic test pattern generator (ATPG) so that fabricated chip testing can be carried out.

Figure 4:
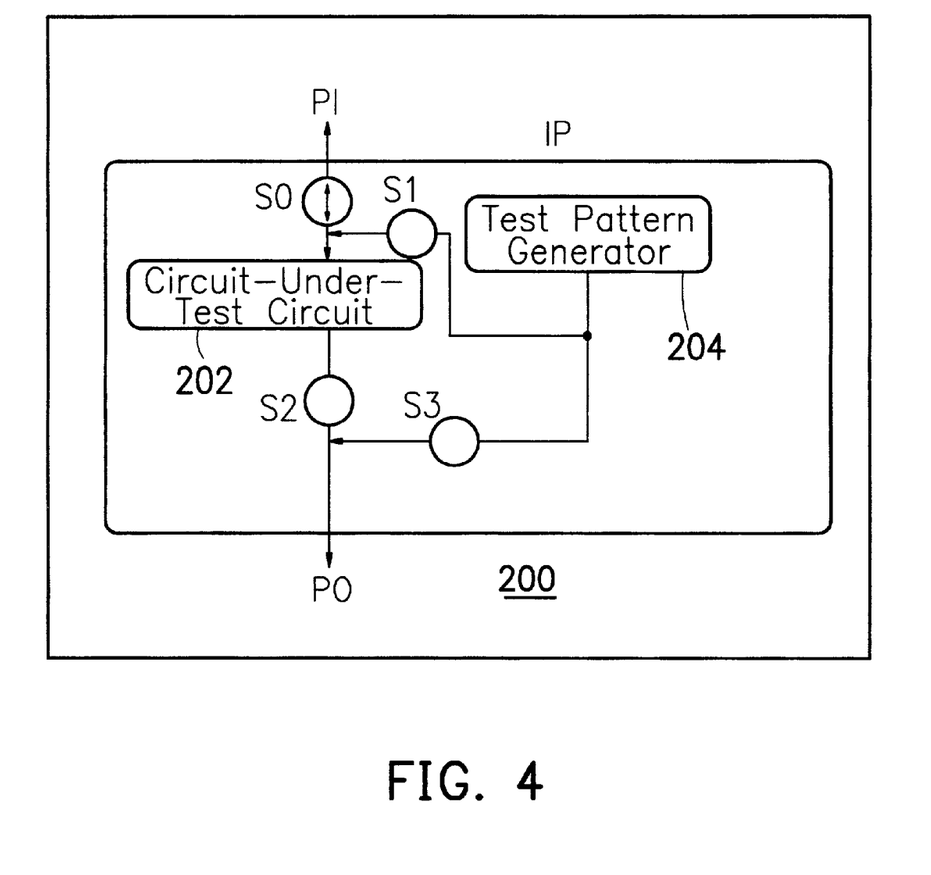
FIG. 4 is a schematic diagram showing the basic structural layout of a built-in verification circuit according to one preferred embodiment of this invention.

FIG. 4 is a schematic diagram showing the basic structural layout of a built-in verification circuit according to one preferred embodiment of this invention. As shown in FIG. 4, the built-in verification circuit 200 includes a circuit-under-test (CUT) circuit 202, a test pattern generator (TPG) 204 and four switches S0–S3 for controlling signal flow. The CUT circuit 202 is positioned between switch S0 and switch S2. The output terminal of the test pattern generator 204 is connected to the switches S1 and S3. The switch S0 is positioned between the primary input (PI) and the CUT circuit 202. The switch S1 is positioned between the CUT circuit 202 and the test pattern generator 204. The switch S2 is positioned between the CUT circuit 202 and the primary output (PO). The switch S3 is positioned between the test pattern generator 204 and the primary output. In addition, the signal flow switches S0–S3 can be further divided into two groups according to mode of operation. The switches S0 and S1 control the primary input and the signal flow direction of the test pattern generator 204, and the switches S2 and S3 control the source of output signal to the primary output. The switch S0 is a bi-directional switch while S1–S3 are unidirectional switches. Table No. 1 below is a listing of various on/off states and their corresponding modes of operation.

TABLE 1

| S0  | S1  | Mode of Operation | S2  | S3  | Mode of Operation |
| --- | --- | ----------------- | --- | --- | ----------------- |
| On  | Off | Normal Operation  | On  | Off | Normal Operation  |
| Off | On  | BIST              | Off | On  | POF Testing       |
| On  | On  | POF Testing       | On  | On  | Not Valid         |
| Off | Off | Not Valid         | Off | Off | Isolation State   |

In Table No. 1, 'On' represents an close state while 'Off' represents a open state.

(a) Mode of operation: normal state (S0=On, S1=Off, S2=On, S3=Off)

In this mode, the test pattern generator 204 is isolated, the CUT circuit 202 receives from the primary input (PI) and output to the primary output (a normal output mode).

(b) Mode of operation: BIST (S0=Off, S1=On, S2=On, S3=Off)

In this mode, the primary input is isolated, the CUT circuit 202 receives from the test pattern generator 204 and output to the primary output (a normal output mode). The circuit works in a way similar to the conventional BIST structure shown in FIG. 1.

(c) Mode of operation: type II POF testing (S0=On, S1=On)

In article [1], POFs are divided into three types: type I POF refers to the occurrence of ordering faults between the input port and the output port of IP; type II POF refers to the occurrence of ordering fault only between the input ports of the IP; and, type III POF refers to the occurrence of ordering fault only between the output ports of the IP. Because input/output port ordering faults can lead to obvious functional errors in the IP, type I POF can be easily detected. Hence, efforts to verify integrity of integrated designs are mainly put on the discovery of the second and the third type of POFs.

Figure 5:
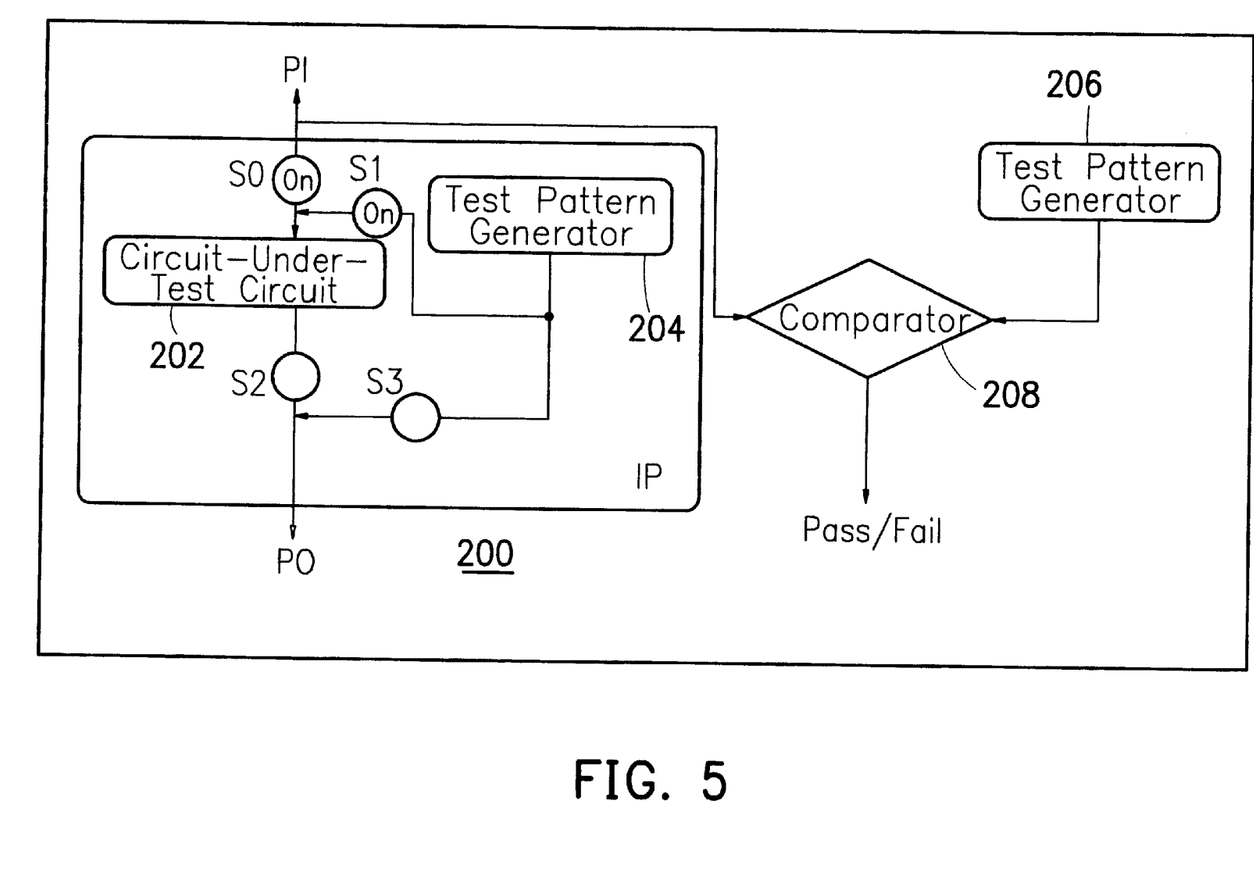
FIG. 5 is a schematic diagram showing the use of a built-in self verification (BISV) structure of this invention for checking a type II port order fault.

FIG. 5 is a schematic diagram showing the use of a built-in self verification (BISV) structure of this invention for checking a type II port order fault. As shown in FIG. 5, an external test pattern generator 206 having functions identical to the built-in test pattern generator 204 is used. Signals from the built-in test pattern generator 204 inside the IP passes through the switches S1 and S0 to a comparator (CMP) 208. Signals from the external built-in test pattern generator 206 also passes into the comparator 208 and compares with signals from the internal generator 204. If no discrepancies are detected by the signal-matching test in the comparator 208, no type II POF is found for the IP model. Conversely, if there is some mismatch of signals after comparison, some type II POF must have occurred inside the IP model.

Figure 6:
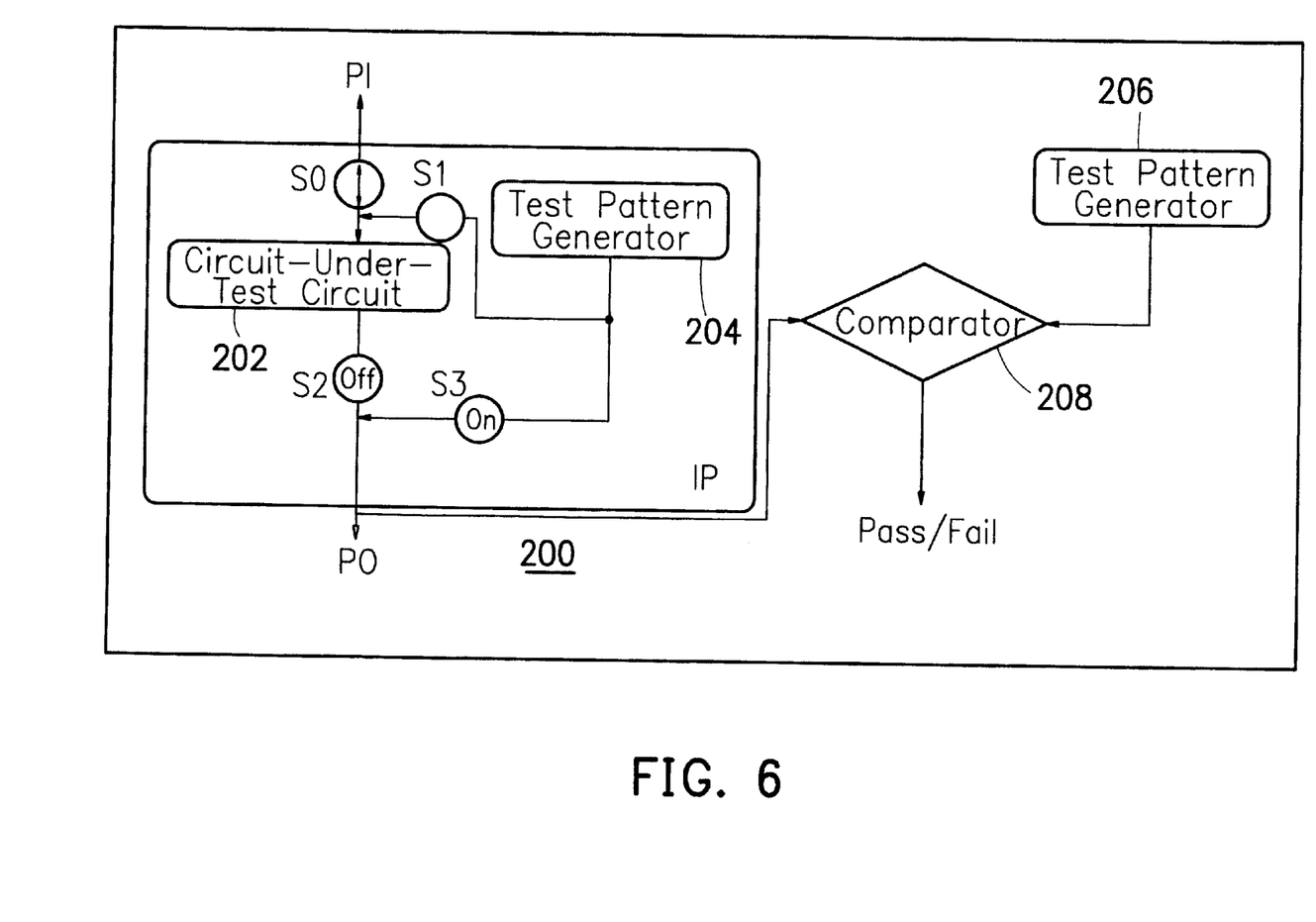
FIG. 6 is a schematic diagram showing the use of a BISV structure of this invention for checking a type III port order fault.

(d) Mode of operation: type III POF testing (S2=Off, S3=On)

FIG. 6 is a schematic diagram showing the use of a BISV structure of this invention for checking a type III port order fault. As shown in FIG. 6, switch S2 is shut off so that output from the CUT circuit 202 is blocked. Therefore, primary output signals are provided by the built-in test pattern generator 204 inside the IP. An external test pattern generator 206 having functions identical to the built-in test pattern generator 204 is also used. Signals from the built-in test pattern generator 204 and signals from the external built-in test pattern generator 206 pass into a comparator 208. If no discrepancies are detected by the signal-matching test in the comparator 208, no type III POF is found for the IP model. However, if there is some mismatch of signals after comparison, some type III POF must have occurred inside the IP model.

Figure 7:
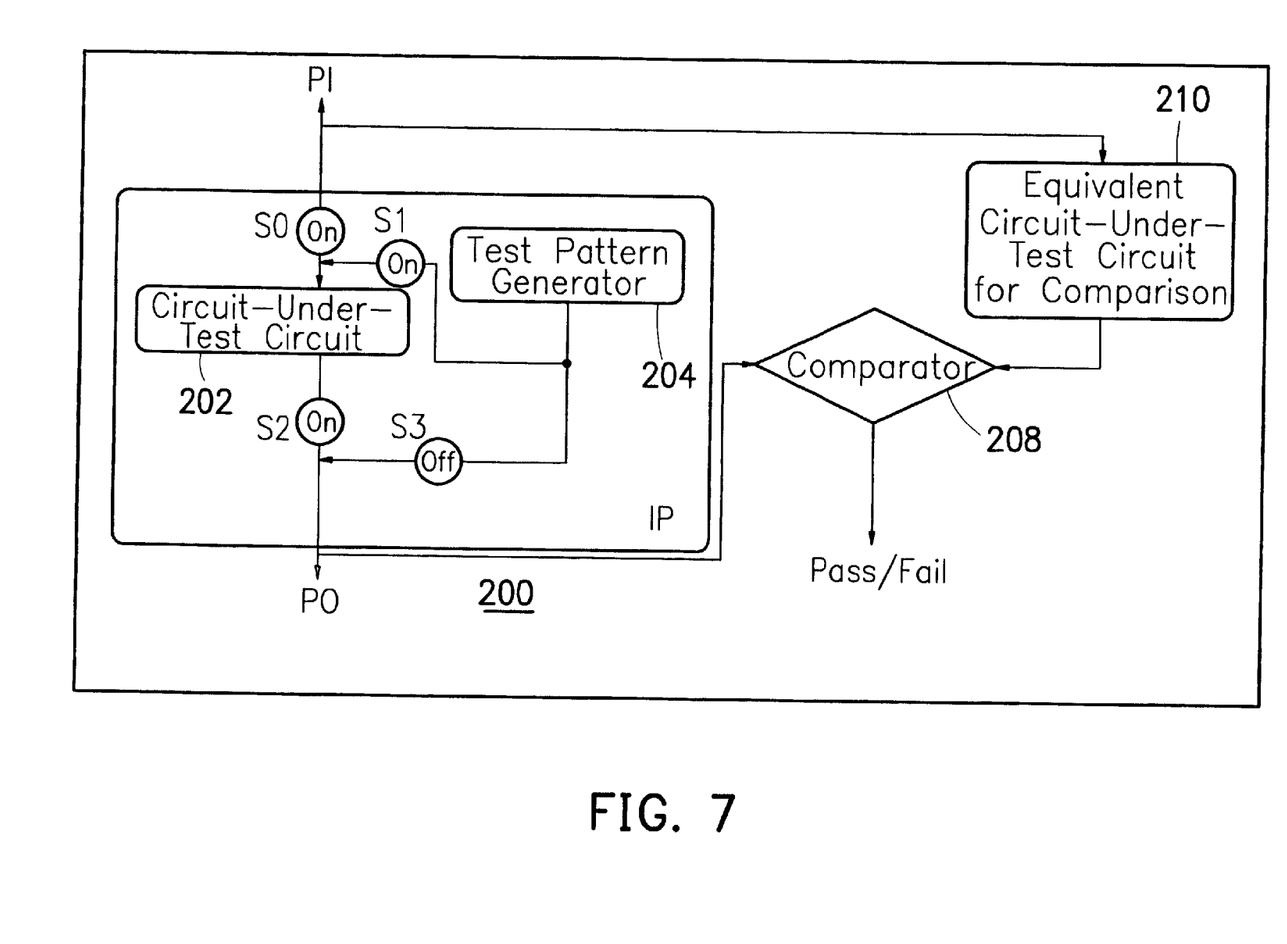
FIG. 7 is a schematic diagram showing the use of a BISV structure of this invention for equivalent testing.

(e) Mode of operation: equivalent testing (S0=On, S1=On, S2=On, S3=Off)

FIG. 7 is a schematic diagram showing the use of a BISV structure of this invention for equivalent testing. This is another state of development of the type II POF testing mode. An external circuit-under-test (CUT) circuit 210 that serves as a standard is provided. The test pattern for both the external CUT circuit 210 and the internal CUT circuit 202 is supplied by the test pattern generator 204. Signals from the internal CUT circuit 202 (or primary output of the IP) and signals from the external CUT 210 are sent to a comparator 208. The comparator 208 compares the signals to determine if identical functions are produced. Hence, any functional nonconformity can be detected.

(f) Mode of operation: isolation state (S2=Off, S3=Off)

In this mode, primary output of the IP is isolated so that the next level of circuit testing can be carried out in a simpler state.

Test pattern generator registers such as linear shift feedback registers (LSFR) or test storage memory can be used to build the test pattern generator (TPG) and conduct the testing. However, design of the TPG is not limited as such. In fact, any system having signal-control switches capable of delivering a preset test pattern to the input/output ports of the IP is also within the scope of this invention.

Using a 4-bit adder with inputs A[3:0] and B[3:0] as an example, the basic test pattern for detecting input/output port order fault includes (A[3:0], B[3:0])={1000_0000, 0100_0000, 0010_0000, 0001_0000, 0000_1000, 0000_0100, 0000_0010, 0000_0001}. This group of testing set includes eight test patterns. By assigning a value different from other ports sequentially, POF testing is activated. Since the adder has identical input bit positions A and B, interchanging input positions A and B have no effect on the resulting outputs. Consequently, the aforementioned testing set can be reduced by half to (A[3:0], B[3:0])={1000_1000, 0100_0100, 0010_0010, 0001_0001}. In reality, the POF testing set for testing an adder can be further reduced. However, the purpose of the example in this invention is simply to illustrate how properties of POF and CUT circuit can affect the testing set in test pattern generation.

In addition, the pattern generated by the TPG includes a group of testing set capable of detecting POF. The method of generating the testing set can be found in article [1], by assigning a value different from other ports sequentially. Moreover, depending on the purpose of testing and CUT circuit characteristics, other testing sets for functional verifications or detection of manufacturing defects can be added.

Figure 8:
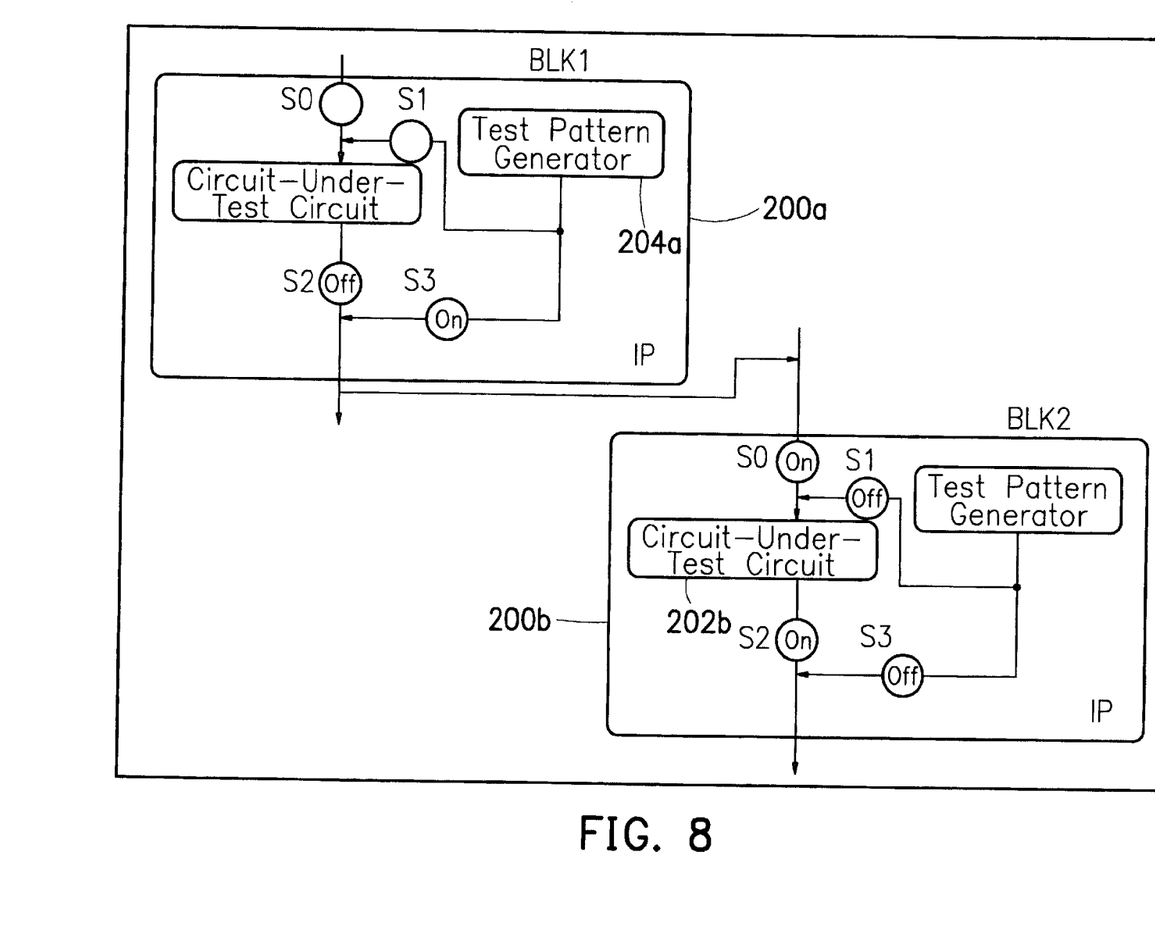
FIG. 8 is a schematic diagram showing the principles behind using a BISV structure of this invention for detecting faults when integrating IPs.

Note that the built-in verification circuit 200 (shown in FIG. 4) can replace the functional blocks 130 and 132 shown in FIG. 3. The resulting basic structure after replacement is shown in FIG. 8. The output terminal of the built-in verification circuit 200a is connected to the input terminal of another built-in verification circuit 200b at the next level.

FIG. 8 is a schematic diagram showing the principles behind the use of a BISV structure for detecting faults when integrating IPs. In FIG. 8, the switch S2 in the built-in verification circuit 200a is 'Off'. The switches S1 and S3 in the built-in verification circuit 200b are 'Off' while the switches S0 and S2 are 'On'. According to the structure shown in FIG. 8, output from the built-in verification circuit 200a is supplied by an internal test pattern generator (TPG) 204a. The test pattern generated by the test pattern generator 204a is transmitted to the input terminal of the built-in verification circuit 200b. After going through the circuit-under-test (CUT) circuit 202b, the test pattern is passed to the output terminal of the built-in verification circuit 200b. According to expected output from the built-in circuit 200b, interconnection errors between the designed blocks (202a and 202b) can be detected. Moreover, the test pattern flows through the internal circuit and input/output ports of the built-in verification circuits 200a and 200b. Hence, not only can interconnection errors between the designed blocks be detected, but any errors in system integration between the designed blocks 202a and 202b can also be detected.

The technique used by the invention has the following characteristics:

1. A detachable built-in test pattern generator (TPG) is used;
2. A switch capable of selecting the source signal for the output port is used;
3. A signal selection switch for the input port capable of bi-directional signal transmission is used.

In addition, the built-in verification circuit of this invention has the following advantages:

1. The invention can be applied to system chip during design verification phase. If special test pattern for testing manufacturing defects is added, the proposed structure of this invention can be used for testing a fabricated chip.
2. Based on the design verification of input/output POF model, the invention can discover not only common errors in designs, but any non-conformity of EDA in IP as well.
3. The detachable test pattern generator (TPG) design of this invention facilitates not only the integration of system chip testing methods, but also able to include the testing sets from a conventional automatic test pattern generator (ATPG). Hence, even real chip can be tested.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A built-in verification circuit of an integrated circuit having an input terminal and an output terminal, comprising:

a circuit-under-test circuit;

a detachable test pattern generator for generating test patterns wherein the test patterns produced by the test pattern generator are based on an input/output port order fault (POF) model;

a bi-directional signal flow switch positioned between the input terminal of the built-in verification circuit and an input of the circuit-under-test circuit;

a first unidirectional signal flow switch positioned between the input of the circuit-under-test circuit and the test pattern generator for controlling a signal flow from the test pattern generator to the circuit-under-test circuit;

a second unidirectional signal flow switch positioned between an output of the circuit-under-test circuit and the output terminal of the built-in verification circuit for controlling a signal flow from the circuit-under-test circuit to the output terminal of the built-in verification circuit; and a third unidirectional signal flow switch positioned between the test pattern generator and the output terminal of the built-in verification circuit for controlling a signal flow from the test pattern generator to the output terminal of the built-in verification circuit, wherein the bi-directional signal flow switch and the first unidirectional signal flow switch arc used for controlling signal flow direction at the input terminal and the test pattern generator, and the second unidirectional signal flow switch and the third unidirectional signal flow switch are used for controlling an output signal to the output terminal of the built-in verification circuit.

2. The built-in verification circuit of claim 1, wherein the built-in verification circuit is working at a normal output/input operating mode when the bi-directional signal flow switch and the second unidirectional signal flow switch are on while the first unidirectional signal flow switch and the third signal flow switch are off.

3. The built-in verification circuit of claim 1, wherein the built-in verification circuit is operating via a built-in self-testing mode while the first unidirectional signal flow switch and the second unidirectional signal flow switch are on and the bi-directional signal flow switch and the third unidirectional signal flow switch are off.

4. The built-in verification circuit of claim 1, wherein the built-in verification circuit is working at a type II port order fault testing mode when the bi-directional signal flow switch is on while the first unidirectional signal flow switch is on.

5. The built-in verification circuit of claim 4, wherein under the type II port order fault testing mode, signals output from an external test pattern generator that has identical functions as the test pattern generator inside the built-in verification circuit is sent together with signals from the internal test pattern generator to a comparator for comparing, the result of the comparison then reveals the occurrence of any type II port order faults within the built-in verification circuit.

6. The built-in verification circuit of claim 1, wherein the built-in verification circuit is working in an equivalent testing mode when the bi-directional signal flow switch and the first unidirectional signal flow switch and the second unidirectional signal flow switch are on while the third unidirectional signal flow switch is off.

7. The built-in verification circuit of claim 6, wherein under the equivalent testing mode, test pattern to the input terminal of an external circuit-under-test circuit that serves as a standard and the circuit-under-test circuit inside the built-in verification circuit are provided by the test pattern generator, signals output from the internal circuit-under-test circuit and signals output from the external circuit-under-test circuit are sent to a comparator for comparing, the result of the comparison then reveals the occurrence of any non-conformity of function of the circuit-under-test circuit.

8. The built-in verification circuit of claim 1, wherein the built-in verification circuit is working at a type III port order fault testing mode when the second unidirectional signal flow switch is off and the third unidirectional signal flow switch is on.

9. The built-in verification circuit of claim 8, wherein under the type III port order fault testing mode, output signals from the output terminal of the built-in verification circuit is provided by the test pattern generator, output signals from the output terminal of the built-in verification circuit and signals from an external test pattern generator having identical functions as the internal test pattern generator arc sent to a comparator for comparing, the results of the comparison then reveals the occurrence of any type III port order fault inside the built-in verification circuit.

10. The built-in verification circuit of claim 1, wherein the built-in verification circuit is working at an isolation mode so that the next level of circuit can be tested in a simpler environment when the second unidirectional signal flow switch and the third unidirectional signal flow switch are off.

* * * * *